United States Patent
Adusumilli et al.

(10) Patent No.: US 11,502,214 B2
(45) Date of Patent: Nov. 15, 2022

(54) PHOTODETECTORS USED WITH BROADBAND SIGNAL

(71) Applicant: GLOBALFOUNDRIES U.S. Inc., Santa Clara, CA (US)

(72) Inventors: Siva P. Adusumilli, South Burlington, VT (US); Mark D. Levy, Williston, VT (US); Yusheng Bian, Ballston Lake, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/196,756

(22) Filed: Mar. 9, 2021

(65) Prior Publication Data

US 2022/0293811 A1   Sep. 15, 2022

(51) Int. Cl.
| | |
|---|---|
| *H01L 31/105* | (2006.01) |
| *H01L 31/18* | (2006.01) |
| *H01L 31/0352* | (2006.01) |
| *H01L 27/146* | (2006.01) |

(52) U.S. Cl.
CPC ...... *H01L 31/105* (2013.01); *H01L 27/14643* (2013.01); *H01L 31/035281* (2013.01); *H01L 31/1804* (2013.01)

(58) Field of Classification Search
CPC ............. H01L 31/105; H01L 27/14643; H01L 27/14645; H01L 31/035281; H01L 31/1804
See application file for complete search history.

(56) References Cited

U.S. PATENT DOCUMENTS

| | | |
|---|---|---|
| 4,799,031 A | 1/1989 | Lang et al. |
| 5,315,128 A | 5/1994 | Hunt et al. |
| 6,452,187 B1 | 9/2002 | Claiborne et al. |
| 7,002,429 B2 | 2/2006 | Asao et al. |
| 7,095,027 B1 | 8/2006 | Boreman et al. |
| 7,777,250 B2 | 8/2010 | Lochtefeld |
| 7,790,495 B2 | 9/2010 | Assefa et al. |

(Continued)

FOREIGN PATENT DOCUMENTS

| | | | | |
|---|---|---|---|---|
| CN | 112885858 A | * | 6/2021 | |
| JP | 2012178429 A | * | 9/2012 | ....... H01L 27/14603 |

(Continued)

OTHER PUBLICATIONS

Huang et al.,"Long Wavelength Resonant Cavity Photodetector Based on InP/Air-Gap Bragg Reflectors," IEEE Photonics Technology Letters, vol. 16, No. 1, pp. 245-247, Jan. 2004, 1 page.

(Continued)

*Primary Examiner* — Earl N Taylor
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to photodetectors used with a broadband signal and methods of manufacture. The structure includes: a first photodetector; a second photodetector adjacent to the first photodetector; a first airgap of a first size under the first photodetector structured to detect a first wavelength of light; and a second airgap of a second size under the second photodetector structured to detect a second wavelength of light.

20 Claims, 6 Drawing Sheets

(56) References Cited

U.S. PATENT DOCUMENTS

| | | | |
|---|---|---|---|
| 7,795,064 | B2 | 9/2010 | Pan et al. |
| 8,625,942 | B2 | 1/2014 | Na et al. |
| 8,877,616 | B2 | 11/2014 | Pinguet et al. |
| 9,028,157 | B2 | 5/2015 | Na et al. |
| 9,059,252 | B1 | 6/2015 | Liu et al. |
| 9,064,699 | B2 | 6/2015 | Wang et al. |
| 9,864,138 | B2 | 1/2018 | Coolbaugh et al. |
| 9,888,194 | B2 | 2/2018 | Duparre |
| 10,157,947 | B2 | 12/2018 | Chen et al. |
| 10,393,960 | B1 | 8/2019 | Shank et al. |
| 10,446,643 | B2 * | 10/2019 | Adusumilli ........ H01L 21/76232 |
| 2002/0148963 | A1 | 10/2002 | Claiborne et al. |
| 2005/0018331 | A1 * | 1/2005 | Pautet .................. G02B 26/001 359/885 |
| 2007/0099315 | A1 | 5/2007 | Maa et al. |
| 2008/0070355 | A1 | 3/2008 | Lochtefeld et al. |
| 2011/0037133 | A1 | 2/2011 | Su et al. |
| 2011/0221599 | A1 | 9/2011 | Högasten |
| 2012/0033119 | A1 * | 2/2012 | Shinohara ........... H01L 27/1463 257/E31.119 |
| 2014/0159183 | A1 | 6/2014 | Na |
| 2016/0155884 | A1 | 6/2016 | Hon et al. |
| 2018/0204761 | A1 * | 7/2018 | Feilchenfeld ......... H01L 29/165 |
| 2019/0043911 | A1 * | 2/2019 | Honda ................ H01L 21/7682 |

FOREIGN PATENT DOCUMENTS

| | | | | |
|---|---|---|---|---|
| WO | WO-2017145815 | A1 * | 8/2017 | ......... H01L 21/7682 |
| WO | WO-2018150801 | A1 * | 8/2018 | ................ G01J 3/26 |

OTHER PUBLICATIONS

D. Knoll et al.,"High-Performance BiCMOS Si Photonics Platform", 2015 Bipolar/BiCMOS Circuitry and Technology Meeting, Oct. 26-28, 2015, 1 page.

M. Selim Unlu et al.,"Resonant Cavity enhanced photonic devices", Applied Physics Review, Department of Electrical, Computer and Systems Engineering and center for Photonics Research, Mar. 1995, 1 page.

Jae HYoung Ryu et al.,"High performance of InGaN light-emitting diodes by air-gap/GaN distributed Bragg reflectors", Optics Express, Sep. 20, 2012, 1 page.

Bian et al., "Towards low-loss monolithic silicon and nitride photonic building blocks in state-of-the-art 300mm CMOS foundry", 2 pages.

Giewont et al., "300-mm Monolithic Silicon Photonics Foundry Technology", IEEE Journal of Selected Topics in Quantum Electronics, vol. 25, No. 5, Sep.-Oct. 2019, 12 pages.

Taillaert et al., "Compact efficient broadband grating coupler for silicon-on-insulator waveguides", Optics Letters, Dec. 1, 2014, vol. 29, No. 23, 3 pages.

Scheerlinck et al., "Efficient, broadband and compact metal grating couplers for silicon-on-insulator waveguides", Optics Express, Jul. 23, 2017, vol. 15, No. 15, 6 pages.

Zaoui et al., "Cost-effective CMOS-compatible grating couplers with backside metal mirror and 69% coupling efficiency", Optics Express, Dec. 10, 2012, vol. 20, No. 26, 6 pages.

Rakowski et al., "45nm CMOS—Silicon Photonics Monolithic Technology (45CLO) for next-generation, low power and high speed optical interconnects", OFC 2020, 3 pages.

Laere et al., "Compact grating couplers between optical fibers and Silicon-on-Insulator photonic wire waveguides with 69% coupling efficiency", Department ofInformation Technology (INTEC), 2006 Optical Society of America, 3 pages.

Zaoui et al., "CMOS-Compatible Polarization Splitting Grating Couplers With a Backside Metal Mirror", IEEE Photonics Technology Letters, vol. 25, No. 14, Jul. 15, 2013, 4 pages.

Selvaraja et al., "Highly efficient grating coupler between optical fiber and silicon photonic circuit", IEEE, 2009, 2 pages.

Specification and drawings in U.S. Appl. No. 17/084,186, filed Oct. 29, 2020, 32 pages.

Specification and Drawings for U.S. Appl. No. 16/544,074, filed Aug. 19, 2019, 26 pages.

Specification and Drawings for U.S. Appl. No. 17/108,732, filed Dec. 1, 2020, 25 pages.

Specification and Drawings for U.S. Appl. No. 16/842,080, filed Apr. 7, 2020, 29 pages.

* cited by examiner

PHOTODETECTORS USED WITH BROADBAND SIGNAL

FIELD OF THE INVENTION

The present disclosure relates to semiconductor structures and, more particularly, to photodetectors used with a broadband signal and methods of manufacture.

BACKGROUND

Photodetectors are devices which precisely convert light into electrical signals, and are used, for example, in many different types of imaging, sensing and communication applications. To this end, photodetectors are generally formed using light sensitive material, such as Si, which are excellent light absorbers. However, in use, photodetectors often do not absorb all of the light which impinges on them, and, in many cases, a substantial amount of light can pass completely through a photodetector without being absorbed. This can lead to problems both in terms of accuracy and efficiency for the devices.

Photodetectors are generally formed using light sensitive material, such as Si, which are excellent light absorbers. However, in use, photodetectors often need to detect specific wavelengths from a broadband source. This currently requires splitters and demultiplexers, which add to the complexity of the fabrication process.

SUMMARY

In an aspect of the disclosure, a structure comprises: a first photodetector; a second photodetector adjacent to the first photodetector; a first airgap of a first size under the first photodetector structured to detect a first wavelength of light; and a second airgap of a second size under the second photodetector structured to detect a second wavelength of light.

In an aspect of the disclosure, a structure comprising: a first photodetector comprising a first airgap structure of a first size and an epitaxial material sealing the first airgap structure; a second photodetector comprising a second airgap structure of a second size and the epitaxial material sealing the second airgap structure; and a shallow trench isolation structure isolating the first photodetector from the second photodetector.

In an aspect of the disclosure, a method comprises: forming a first photodetector; forming a second photodetector; forming a first airgap of a first size under the first photodetector; and forming a second airgap of a second size under the second photodetector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to photodetectors used with a broadband signal and methods of manufacture. More specifically, the present disclosure provides a photodetector that is capable of detecting different wavelengths from a broadband source. For example, in embodiments, the photodetectors comprises multiple Ge photodetectors with different-sized airgap structures below the photodetectors. Advantageously, the airgap structures below the photodetectors can amplify desired wavelengths, improve mirror reflectivity and can be individually tunable to different wavelengths. In addition, the airgap structures under the photodetectors act as a mirror allowing for a thinner Ge region needed to absorb electromagnetic radiation (e.g., light), i.e., approximately 10-30% reduction in Ge thickness.

In more specific embodiments, the photodetectors include underlying airgap structures with certain curvatures which act as a spherical mirror, and whose sizes can vary to amplify selected wavelengths. The airgap structures can be comprised of a single cavity or conjoined cavities to form tunable airgap structures under the photodetectors. Multiple sized airgap structures are possible on a same plane for different wavelength detection. And, the airgap structures can be sized (tuned) for constructive interference of desired wavelengths, i.e., wavelength tuning.

For example, the airgap structures of different sizes under respective photodetectors (e.g., co-planar Ge detector) can detect different wavelengths of light, with a smaller airgap structure detecting a shorter wavelength and a larger airgap structure detecting a longer wavelength. Moreover, the different photodetectors and airgap structures can be mixed within a region or segregated in different regions on the same chip. Also, the photodetectors can be co-planar (e.g., Ge based photodetectors)

The photodetector of the present disclosure can be manufactured in a number of ways using a number of different tools. In general, though, the methodologies and tools are used to form structures with dimensions in the micrometer and nanometer scale. The methodologies, i.e., technologies, employed to manufacture the photodetector of the present disclosure have been adopted from integrated circuit (IC) technology. For example, the structures are built on wafers and are realized in films of material patterned by photolithographic processes on the top of a wafer. In particular, the fabrication of the photodetector uses three basic building blocks: (i) deposition of thin films of material on a substrate, (ii) applying a patterned mask on top of the films by photolithographic imaging, and (iii) etching the films selectively to the mask.

Figure 1:
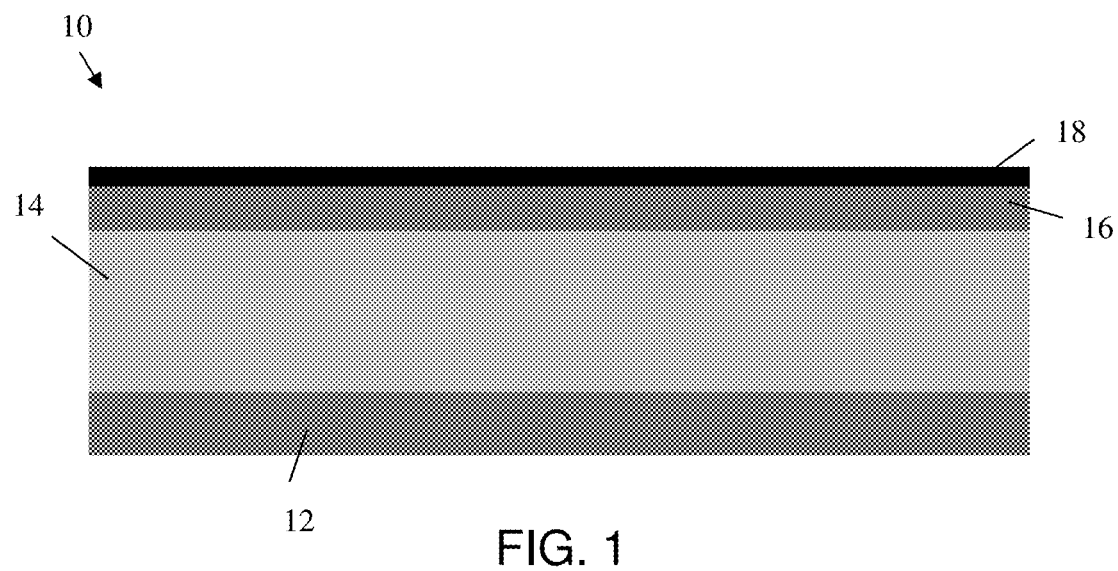
FIG. 1 shows an incoming structure in accordance with aspects of the present disclosure.

FIG. 1 shows an incoming structure in accordance with aspects of the present disclosure. In particular, the structure 10 includes a substrate 12 comprising any bulk semiconductor material. For example, the substrate 12 can be composed of any suitable bulk semiconductor materials such as, e.g., Si, SiGe, SiGeC, SiC, GaAs, InAs, InP, and other III/V or II/VI compound semiconductors. In embodiments, the substrate 12 can be a p-type substrate with an additional highly doped region 14. The additional doped region 14 comprises a p-type dopant, e.g., Boron (B), for a p-type doped region. An undoped semiconductor material 16 can be formed over the doped region 14. In embodiments, the undoped semiconductor material 16 can be intrinsic Si material epitaxially grown on the doped region 14. The undoped semiconductor material 16 effectively buries the doped region 14 deeper into the substrate.

Still referring to FIG. 1, one or more pad films 18 can be formed, e.g., deposited, on the undoped semiconductor material 16. The pad films 14 can be oxide or nitride, as examples. By way of illustrative, non-limiting examples, the nitride can be deposited by a conventional deposition process, e.g., chemical vapor deposition (CVD), to a thickness of about 100 nm to 200 nm; whereas, the oxide can be deposited to a thickness of about to 10 nm. In embodiments, the oxide can be formed in furnace oxidizations of Si when the substrate 12 comprises Si material.

Figure 2:
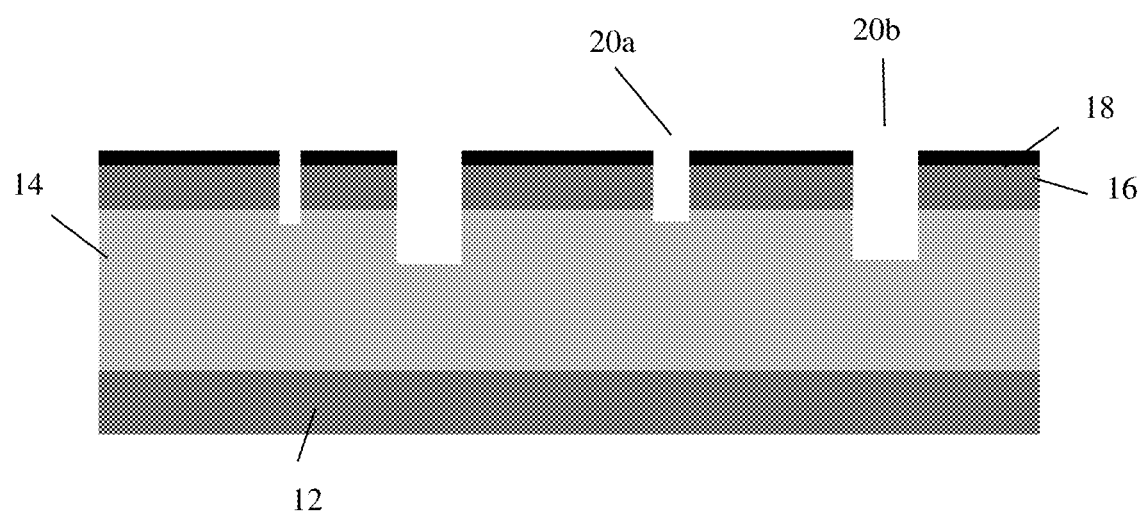
FIG. 2 shows a plurality of trenches patterned in pad dielectric films and a substrate, and respective fabrication processes in accordance with aspects of the present disclosure.

In FIG. 2, a plurality of trenches 20a, 20b can be patterned in the pad films 14 and into the substrate 12, 16. In embodiments, the plurality of trenches 20a, 20b can be of different widths and/or of different depths depending on the wavelength to be detected by the photodetector as described in more detail herein. In embodiments, each of the trenches 20a, 20b can extend into the doped region 14, with the trenches 20a being smaller in width and/or depth than the trenches 20b. In an illustrative, non-limiting example, the trenches 20a, 20b can have a width ranging from about 0.1 µm to 0.20 µm and a depth ranging from about 0.5 µm to 0.7 µm; although other dimensions are contemplated herein based on the specific wavelengths to be detected by the photodetector.

The trenches 20a, 20b can be formed using conventional lithography and etching processes. For example, a resist formed over the pad films 18 is exposed to energy (light) to form a pattern (opening). The openings can be of different dimensions to match the different widths (and lengths) of the trenches 20a, 20b. An etching process with a selective chemistry, e.g., reactive ion etching (RIE), will be used to form the trenches 20a, 20b through the openings of the resist, through the pad film(s) 18 and into the substrate 12. The resist can then be removed by a conventional oxygen ashing process or other known stripants.

Figure 3:
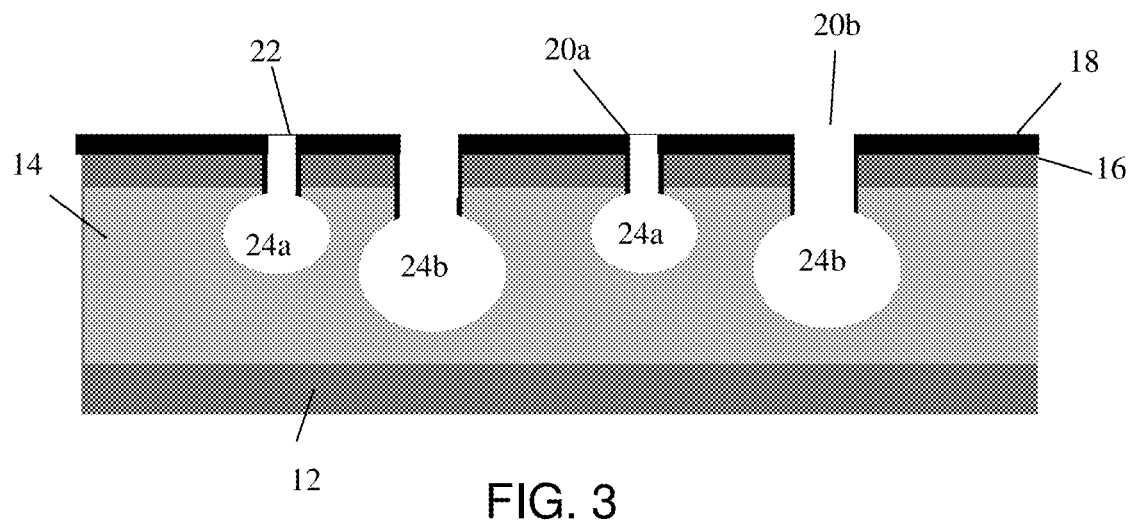
FIG. 3 shows trenches lined with liner material and cavity structures of different sizes, amongst other features, and respective fabrication processes in accordance with aspects of the present disclosure.

Referring to FIG. 3, a sidewall liner 22 can be formed on the sidewalls of the trenches 20a, 20b by depositing a dielectric material followed by an anisotropic etching process of the dielectric material at the bottom of the trenches 20a, 20b and top planar features of the structure. In embodiments, the sidewall liner 22 can be any suitable dielectric material(s) such as oxide or nitride or a combination of dielectric layers deposited using any known deposition method, e.g., CVD, thermal oxidization of the silicon substrate, atomic layer deposition (ALD) or any combinations thereof. The anisotropic etch comprises a RIE using a perfluorocarbon-based chemistry, which etches material from planar surfaces but leaves the dielectric material (e.g., sidewall liner 22) on the sidewall of the trenches 20a, 20b.

In embodiments, the sidewall liner 22 should robustly coat the sidewalls of the trenches 20a, 20b in order to protect the underlying substrate 12, 16 (including the highly doped region 14 of the substrate 12) from subsequent etching processes (for cavity formation). To achieve this robust sidewall coverage, the dielectric material or materials should be thick enough to leave a film on the sidewalls of the trenches 20a, 20b, but not too thick that it pinches off the top opening of the trenches 20a, 20b preventing cavity formation during the successive cavity etch process.

As further shown in FIG. 3, cavity structures 24a, 24b can be formed in the substrate 12 by a substrate etching process through the bottom of the trenches 20a, 20b, respectively. The pad films 18 on the substrate surface and the sidewall liner 22 of the trenches 20a, 20b protect the substrate 12 from being unintentionally etched during formation of the cavity structures 24a, 24b. The removal of the material of the substrate 12, 16 can be by a wet etching process or dry etching process. For example, dry etchants can include plasma-based $CF_4$, plasma-based $SF_6$, or gas $XeF_4$ silicon etch, etc., and wet etching processes can include KOH and $NH_4OH$.

The cavity structures 24a, 24b can be of different dimensions as a result of using the trenches 20a, 20b of different dimensions. For example, the cavity structures 24a, 24b will be wider (and deeper) when using a deeper and/or wider trench 20b. Similarly, the cavity structures 24a, 24b will be narrower (and shallower) when using a shallower and/or narrower trench 20a. This is due to the fact that more etchant chemistries can enter into the deeper and/or wider trenches 20b, hence eroding away more substrate material. In an illustrative, non-limiting example, the cavity structures 24a, 24b can range in size from about 200 nm to 2 µm in diameter.

In embodiments, prior to the cavity formation, an optional vapor or liquid HF treatment, hydrogen plasma, anneal, basic or acidic chemical clean, or any process known to remove thin or native dielectrics or residual spacer etch polymer from the substrate 12 (e.g., silicon) can be used to remove any excessive dielectric at a bottom of the trenches 20a, 20b. The post sidewall liner etch cleans (e.g., anisotropic etch) should leave a robust dielectric liner, e.g., sidewall liner 22, on the top corner and sidewall of the trenches 20a, 20b to prevent etching of the substrate 12 through the sidewall of the trenches 16 during the cavity formation.

Figure 4:
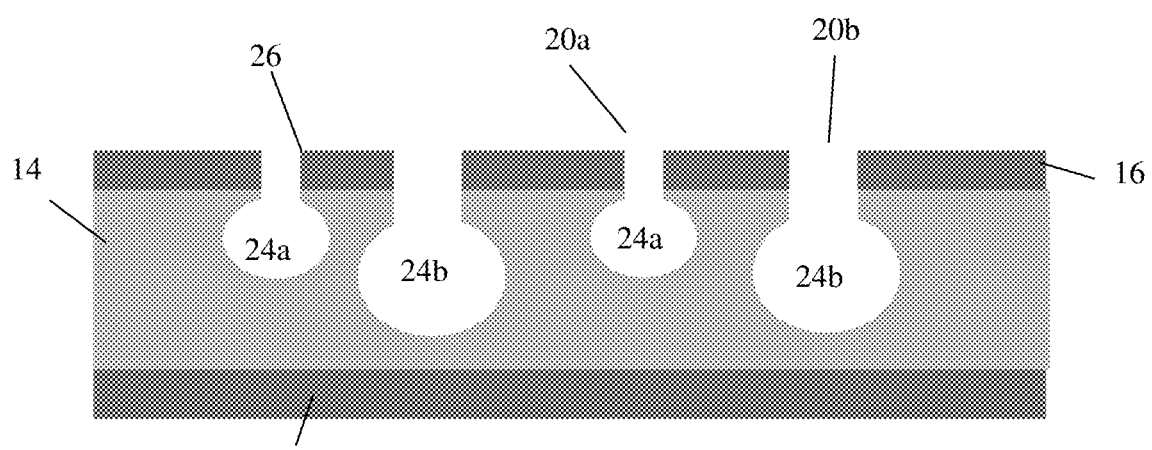
FIG. 4 shows the trenches stripped of the liner material, amongst other features, and respective fabrication processes in accordance with aspects of the present disclosure.

In FIG. 4, the sidewall liner and pad film(s) can be removed from the structure, exposing the upper surface of the substrate 16 and the sidewalls of the trenches 20a, 20b. In embodiments, the sidewall liner and pad film(s) can be removed by a conventional etching process selective to such materials. For example, the sidewall liner and pad dielectric film(s) can be removed by hot phosphorous followed by an HF chemistry or vice-versa depending on the single dielectric layer or stack of different dielectric layers used for sidewall liner.

Following the removal of the sidewall liner and pad film(s), the trenches 20a, 20b can be subjected to an optional annealing process to soften or round (curve) the edges of the trenches 20a, 20b. In embodiments, the annealing can be performed in a $H_2$ or other hydrogen atmosphere which may also remove any native or other oxide from the silicon substrate surface. The annealing can also be provided in other atmospheres, e.g., $NH_3$, $B_2H_6$, Phi, $AsH_2$ or other gases bonded to hydrogen. By way of one example, following an HF preclean process, the structure can undergo an annealing process at a temperature range of about 800° C. to about 1100° C., for up to about 60 seconds. If little or no curvature is required, then the annealing temperature, time, or hydrogen-based gas flow can be reduced to eliminate or minimize the silicon substrate reflow. Accordingly, it should be understood by those of skill in the art that the curvature can be adjusted by temperature and gas flow.

In embodiments, the critical dimension between the optionally curved silicon at the top of the trenches 20a, 20b can be increased by approximately 20% or more during the anneal. For example, with a trench opening of 120 nm, the critical dimension of the silicon curvature post annealing can increase to about 156 nm, as one non-limiting illustrative example. In this way, the volume at the opening at the top of the trenches 20a, 20b can be increased, which effectively allows for more material to be deposited and reflowed therein to completely seal the trenches.

Figure 5:
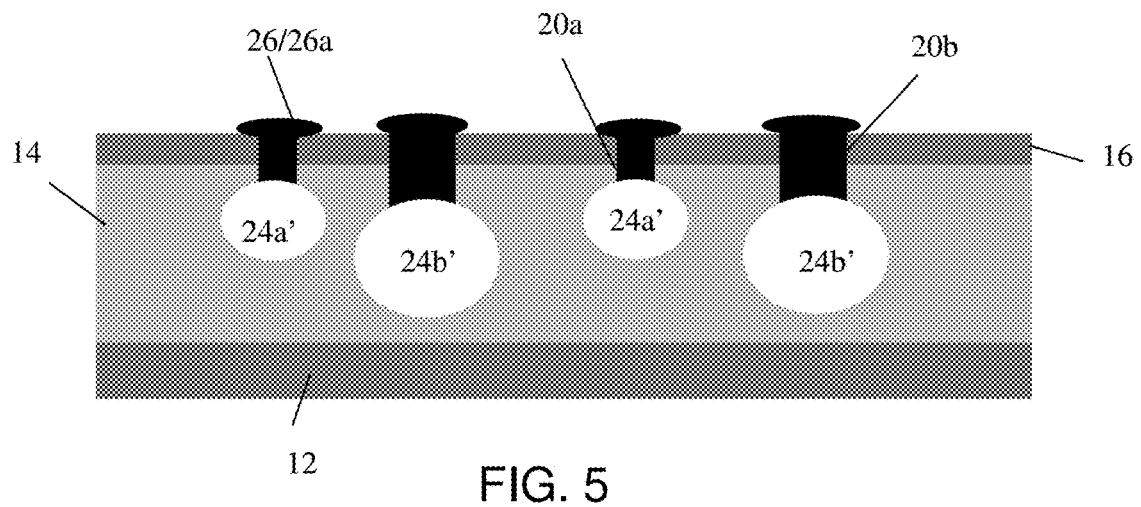
FIG. 5 shows sealed airgap structures of different sizes, amongst other features, and respective fabrication processes in accordance with aspects of the present disclosure.

In FIG. 5, a material 26 can be formed on the surface of the substrate 16 including sidewalls of the trenches 20a, 20b and sidewalls of the cavity structures 24a, 24b. In embodiments, the material 26 can be epitaxial Ge or SiGe material deposited using ultra high vacuum CVD (UHVCVD); although other photodetector semiconductor materials formed in the trenches 20a, 20b are contemplated herein. Also, the material 26 should have a lower reflow temperature than Si or other material of the substrate 12, 16. In this example, the material 26 can be deposited at a temperature of about 600° C. to 750° C., resulting in a thickness of about 100 nm to about 1 µm; although other thicknesses of the material 26 can be applied depending on the critical dimension of the trenches 20a, 20b. For example, more material can be deposited with larger trenches.

As further shown further in FIG. 5, the wafer is heated to equal to or greater than the reflow temperature of the material so that the material forms a plug 26a filling the top of trenches 20a, 20b. It should be understood by those of ordinary skill in the art that the epitaxial Ge or SiGe material (e.g., plug 26a) has reflective characteristics, which assist in light reflection and, accordingly, can act as a photodetector which are coplanar with one another. The plug 26a also seals the cavity structures forming the sealed airgap structures 24a', 24b'. It is contemplated that some material 26 can remain as a liner in the sealed airgap structures 24a', 24b'.

In embodiments, the sealed airgap structures 24a', 24b' can have a diameter ranging from about 200 nm to 2 µm. Also, the material 26 can reflow and seal or plug the trenches 20a, 20b without filling in the cavity structures 24a, 24b. The reflow temperature can be 800-1050° C. and the reflow time can be anywhere up to about 600 seconds, as examples. In general, the thickness and other dimensions of the reflowed material 26 that forms the plug 26a can vary depending on the depth and other dimensions of the trenches 20a, 20b. Illustratively, the plug 26a can be thicker with a deeper trench 20b, wider with a wider trench 16b and longer with a longer trench 16b. It should also be understood that the plug 26a, e.g., photodetector material, can have a variety of shapes including circular, oval, hexagonal, octagonal, square, oblong, etc., depending on the shape of the trenches 20a, 20b.

Figure 6:
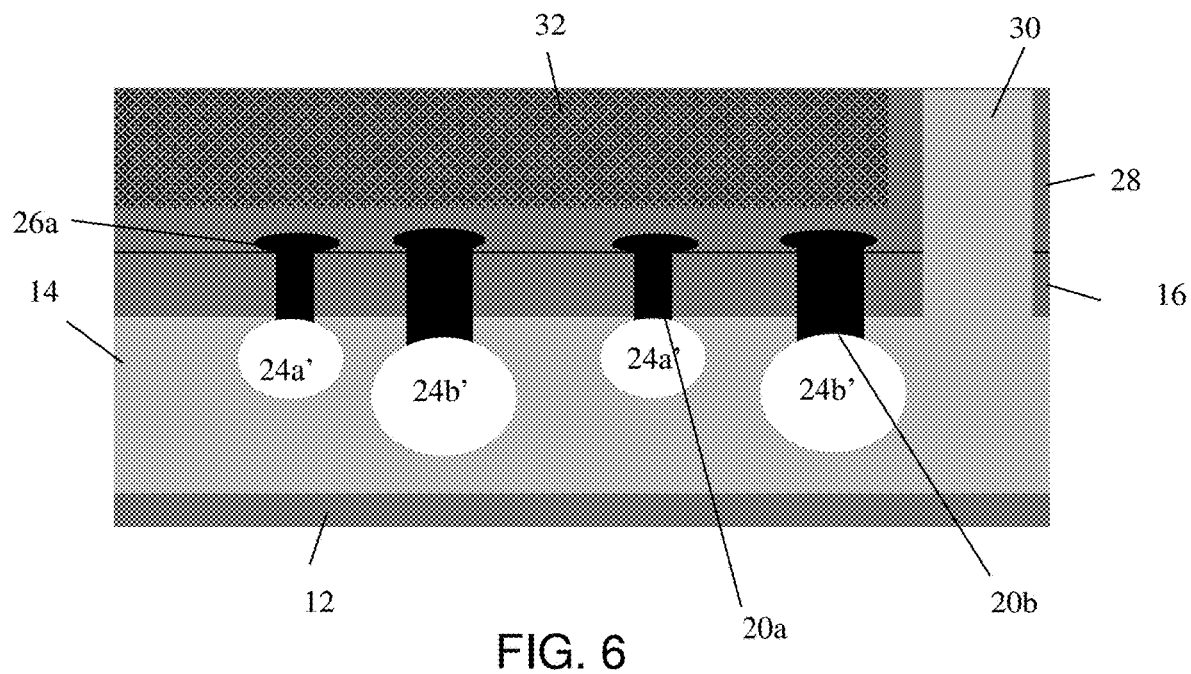
FIG. 6 shows doped epitaxial material over the sealed airgap structures, amongst other features, and respective fabrication processes in accordance with aspects of the present disclosure.

In FIG. 6, an epitaxial semiconductor material 28 can be formed (e.g., grown) over the sealed airgap structures 24a', 24b', i.e., the plug (photodetector material) 26a. In embodiments, the epitaxial semiconductor material 28 can be intrinsic Si material with a planar upper surface. An n-doped region 32 can be formed in the epitaxial semiconductor material 28 over the sealed airgap structures 24a', 24b' by an ion implantation process using n-type dopant, e.g., e.g., Arsenic (As), Phosphorus (P) and Sb, among other suitable examples. In this way, the photodetector may be a P-I-N photodiode (e.g., comprising p-doped region 14, intrinsic material 16, 28 and n-doped region 32) or an avalanche junction photodetector. It is also contemplated that additional p-type doping of the epitaxial semiconductor material 28 can be used to form a P-I-P-N photodiode.

The epitaxial semiconductor material 28 can also include a p-doped region 30 contacting the doped region 14, on a side of the sealed airgap structures 24a', 24b'. The p-doped region 30 can be formed by an ion implantation process using a p-type dopant, e.g., Boron. This allows for contacts to be electrically connected to the photodetector from the underside of the structure, e.g., by contacting the p-doped region 14.

Figure 7:
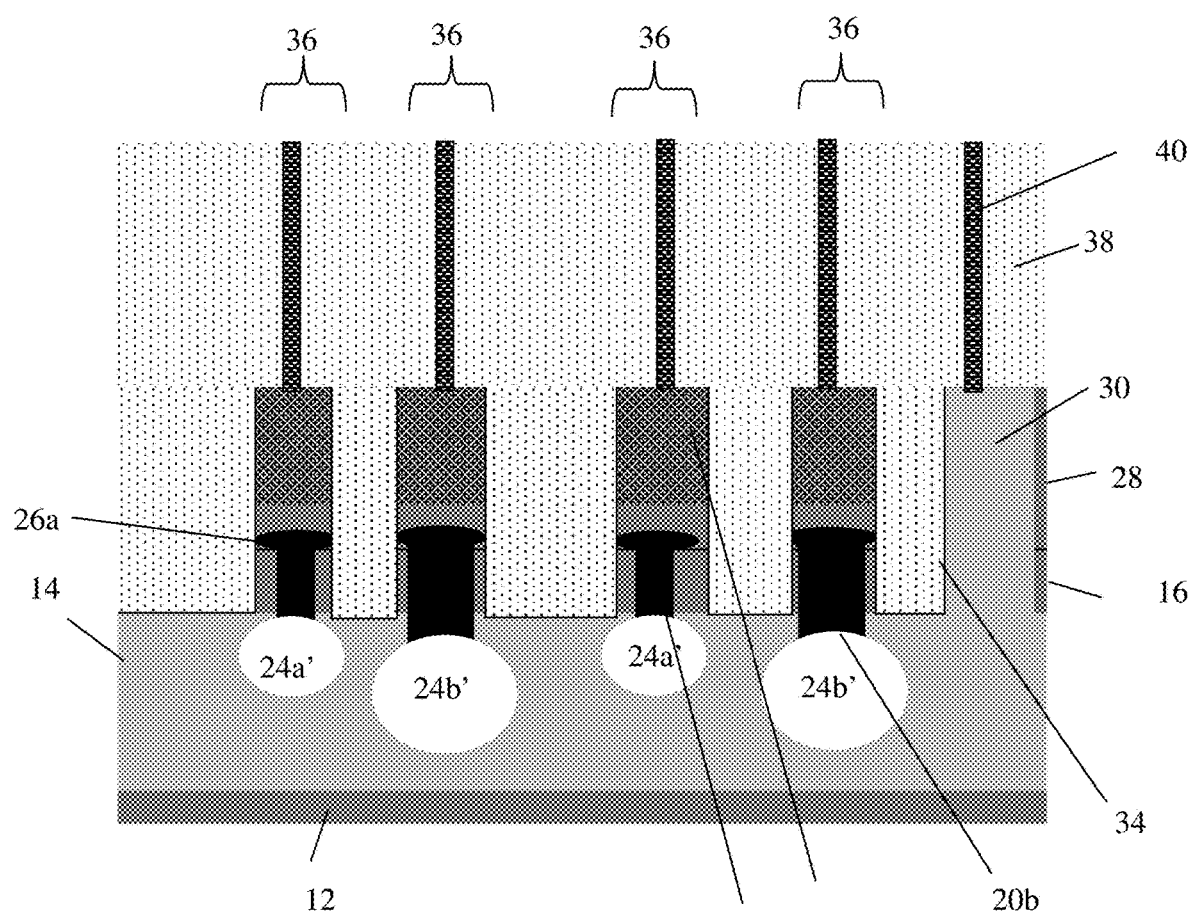
FIG. 7 shows contacts to photodetectors, amongst other features, and respective fabrication processes in accordance with aspects of the present disclosure.

FIG. 7 shows separate photodetectors 36 separated by shallow trench isolation regions 34. The shallow trench isolation regions 34 are formed in the epitaxial semiconductor material 28, effectively isolating and separating the individual photodetectors 36. In embodiments, the individual photodetectors 36 can have a width of up to about 0.25 µm. The shallow trench isolations structures 34 are formed by conventional lithography, etching and deposition processes known to those of skill in the art such that no further explanation is required for a complete understanding of the present disclosure.

As should be understood, each photodetector 36 comprises the p-doped region 14, a sealed airgap structure 24a' or 24b', the photodetector material 26a, the intrinsic material 16, 28 and the n-doped region 32. And, as should now be understood by those of ordinary skill in the art, the photodetectors 36 can detect different wavelengths depending on the size and/or shape of the respectively sealed airgap structure 24a', 24b'.

Still referring to FIG. 7, an interlevel dielectric material 38, e.g., $SiO_2$, can be formed over the shallow trench isolation structures 34, the n-doped region 32, and the p-doped region 14. The interlevel dielectric material 38 can be deposited by a conventional CVD process. A plurality of contacts 40 can be formed in the interlevel dielectric material 38, electrically connecting (e.g., contacting) with the photodetectors 36, e.g., n-doped region 32, and the p-doped region 14. The contacts 40 can be formed by conventional lithography, etching and deposition processes such that no further explanation is required for a complete understanding of the present disclosure. The contacts 40 can also undergo a conventional planarization process, e.g., chemical mechanical polishing.

The respectively sealed airgap structure 24a', 24b' of different dimensions can be used to detect different wavelengths. For example, the etching processes for forming the individual cavity structures and, subsequently, the respectively sized airgap structure 24a', 24b' can be controlled to provide an optimal radius of curvature for the curved lower surfaces for focusing reflected light back to a lower surface of the photodetector, e.g., plug 26a. In this way, the different dimensions of the individual airgap structure 24a', 24b' provide different absorption properties and, hence, can be used for detecting different wavelengths. The multiple sized airgap structures are on a same plane for different wavelength detection, each of which can be tuned for constructive interference of desired wavelengths, i.e., wavelength tuning.

Figure 8:
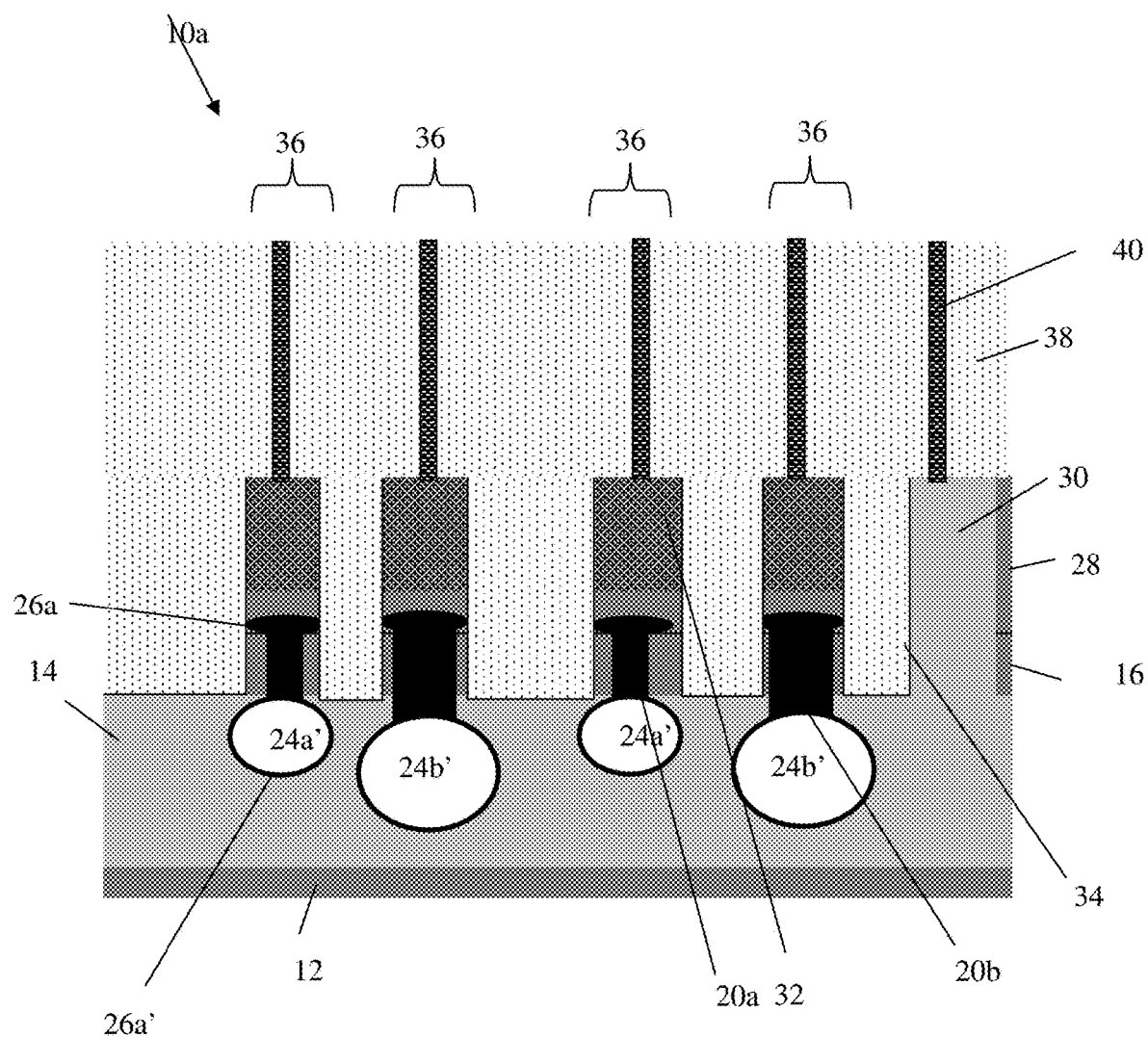
FIG. 8 shows the photodetectors with sealed airgap structures of different sizes lined with epitaxial material, amongst other features, and respective fabrication processes in accordance with aspects of the present disclosure.

FIG. 8 shows the photodetector with sealed airgap structures of different sizes and which are each lined with epitaxial material, amongst other features. More specifically, the structure 10a shown in FIG. 8 includes the sealed airgap structure 24a', 24b' of different dimensions lined with material 26a'. In embodiments, the material 26a' is epitaxial semiconductor material. More specifically, the material 26a' is epitaxial SiGe material which can be formed during the processes as described with respect to FIG. 5, i.e., forming the plugs 26a for sealing of the cavity structures. The thickness of the material 26a' on the sidewalls of the sealed airgap structure 24a', 24b' can vary depending on the dimensions of the sealed airgap structure 24a', 24b'. For example, the thickness of the material can range from about 5 nm to about 100 nm, with a thicker material lining the larger sealed airgap structure 24b'. By way of further example, the thickness of the liner material 26a' can be dependent on the size of the trench opening with a larger trench opening allowing a thicker liner of the material.

Figure 9:
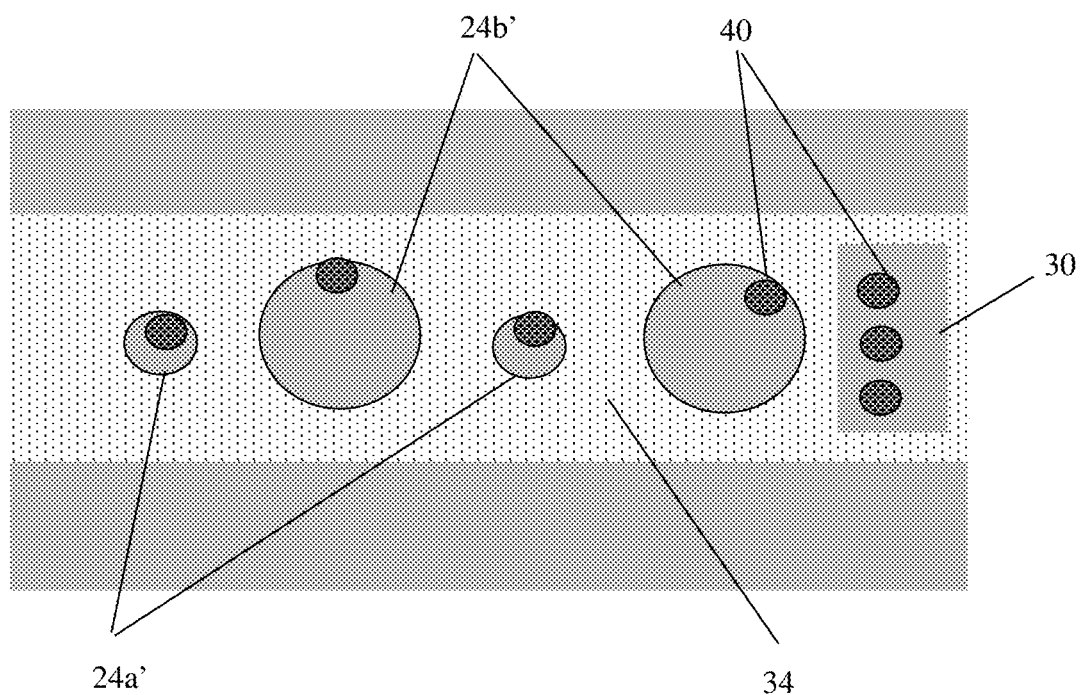
FIG. 9 shows a top view of the structure of either FIG. 7 or FIG. 8.

FIG. 9 shows a top view of the structure of either FIG. 7 or FIG. 8. As shown in this view, the contacts 40 are off-centered with respect to the sealed airgap structure 24a', 24b'. Although shown as circles, it is should also be understood by those of ordinary skill in the art that the sealed airgap structure 24a', 24b' can be ovals or other shapes as described herein. Also, as shown from this perspective, the shallow trench isolation material separates the contacts for each of the sealed airgap structure 24a', 24b', e.g., material 40, 32, 16.

It should be understood by those of ordinary skill in the art that lower surface of any of the above described airgap structure 24a', 24b' will reflect paraxial rays of light passing through the photodetector, thereby increasing the efficiency of light absorption by the photodetector. This concept holds true for using different sized air-gap structures. In particular, the lower surfaces of the respective airgap structure 24a', 24b' can be configured to have a radius of curvature, relative to a center of curvature, such that the paraxial rays of light passing through the photodetector will be reflected back from a pole point P of the curved lower surface located along a principle axis of the rays of light to a focal point F based on the focal length of the converging mirror formed by the curved lower surfaces. In accordance with aspects of the present disclosure, the lower surfaces can be configured so that the focal point can be located at a lower surface of the photodetector. For example, the spherical radius of curvature around the center of curvature can be 500 nm, with a focal length of 250 nm for the focal point. In other words, in this example, the distance between the pole point for the curved lower surface to the bottom surface of the photodetector can be 250 nm. Of course, other spacings are envisioned in accordance with the present disclosure.

The photodetectors can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a first photodetector to detect a first wavelength of light;
   a second photodetector adjacent to the first photodetector to detect a second wavelength of light;
   a first airgap of a first size under the first photodetector which is individually tunable to the first wavelength of light; and
   a second airgap of a second size under the second photodetector which is individually tunable to the second wavelength of light.

2. The structure of claim 1, wherein the first size and the second size comprise different dimensions.

3. The structure of claim 1, wherein the first size and the second size comprise different curvatures at a bottom portion.

4. The structure of claim 1, further comprising a first trench of a first size that connects to the first airgap and a second trench of a second size that connects to the second airgap.

5. The structure of claim 4, wherein a deeper or wider first trench extends to the first airgap of larger size than the second airgap, and a shallower or narrower second trench extends to the second airgap of smaller size than the first airgap.

6. The structure of claim 1, wherein the first airgap and the second airgap are located in a P-doped region of a substrate, intrinsic semiconductor material is over the first photodetector and the second photodetector, and N-doped semiconductor material is over the intrinsic semiconductor material.

7. The structure of claim 6, further comprising shallow trench isolation structures extending to the intrinsic semiconductor material and the N-doped semiconductor material of different photodetectors.

8. The structure of claim 7, further comprising a first contact connecting to the N-doped semiconductor material of the first photodetector, a second contact connecting to the N-doped semiconductor material of the second photodetector, and a third contact electrically connecting to the P-doped region of the substrate.

9. The structure of claim 1, wherein the first photodetector and the second photodetector each comprises a plug of epitaxial semiconductor material in respective trenches extending to the first airgap and the second airgap.

10. The structure of claim 1, wherein the first photodetector and the second photodetector comprise Ge material that seals the first airgap and the second airgap.

11. The structure of claim 1, wherein the first photodetector and the second photodetector comprise SiGe material that seals the first airgap and the second airgap.

12. A structure comprising:
   a first photodetector comprising a first airgap structure of a first size and an epitaxial material sealing the first airgap structure;
   a second photodetector comprising a second airgap structure of a second size and the epitaxial material sealing the second airgap structure; and
   a shallow trench isolation structure isolating the first photodetector from the second photodetector.

13. The structure of claim 12, wherein
   the first photodetector further comprises:
      an intrinsic semiconductor material over the epitaxial material sealing the first airgap structure; and
      a n-doped semiconductor material above the intrinsic semiconductor material; and
   the second photodetector further comprises:
      the intrinsic semiconductor material over the epitaxial material sealing the second airgap structure; and
      the n-doped semiconductor material above the intrinsic semiconductor material.

14. The structure of claim 12, wherein the first size and the second size comprise different dimensions.

15. The structure of claim 12, further comprising a first trench of a first size connecting to the first airgap structure and a second trench of a second size connecting to the second airgap structure.

16. The structure of claim 15, wherein the first trench is deeper or wider than the second trench.

17. The structure of claim 15, wherein the epitaxial material plugs the first trench and the second trench to seal the first airgap structure and the second airgap structure.

18. The structure of claim 12, wherein the epitaxial material comprises Ge material that seals the first airgap structure and the second airgap structure.

19. The structure of claim 12, wherein the epitaxial material comprises SiGe material that seals the first airgap structure and the second airgap structure.

20. A method comprising:
   forming a first photodetector;
   forming a second photodetector;
   forming a first airgap of a first size under the first photodetector;
   sealing the first airgap with epitaxial material;
   forming a second airgap of a second size under the second photodetector;
   sealing the second airgap with the epitaxial material; and
   forming a shallow trench isolation structure isolating the first photodetector from the second photodetector.

* * * * *